(12) United States Patent
Gao et al.

(10) Patent No.: US 12,395,576 B2
(45) Date of Patent: Aug. 19, 2025

(54) ROTATING MECHANISM, SUPPORT APPARATUS, AND ELECTRONIC DEVICE

(71) Applicant: HONOR DEVICE CO., LTD., Guangdong (CN)

(72) Inventors: Jiuliang Gao, Shenzhen (CN); Bin Yan, Shenzhen (CN); Shaohong Dong, Shenzhen (CN); Yihe Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/016,740

(22) PCT Filed: Sep. 1, 2022

(86) PCT No.: PCT/CN2022/116604
§ 371 (c)(1),
(2) Date: Jan. 18, 2023

(87) PCT Pub. No.: WO2023/065850
PCT Pub. Date: Apr. 27, 2023

(65) Prior Publication Data
US 2024/0244127 A1   Jul. 18, 2024

(30) Foreign Application Priority Data
Oct. 19, 2021   (CN) .......................... 202122516974.3

(51) Int. Cl.
H05K 5/02   (2006.01)
H04M 1/02   (2006.01)

(52) U.S. Cl.
CPC ....... *H04M 1/0214* (2013.01); *H04M 1/0268* (2013.01); *H05K 5/0226* (2013.01)

(58) Field of Classification Search
CPC .. H05K 5/0226; H05K 5/0017; H05K 5/0217; H04M 1/0214; H04M 1/0268;
(Continued)

(56) References Cited

U.S. PATENT DOCUMENTS 10,761,574 B1   9/2020   Hsu et al.
11,073,870 B2   7/2021   Yun et al.
(Continued)

FOREIGN PATENT DOCUMENTS

CN   110035143 A   7/2019
CN   111199687 A   5/2020
(Continued)

*Primary Examiner* — Abhishek M Rathod

(57) ABSTRACT

A rotating mechanism includes a base, a first door plate, and a first connecting arm. Two axial ends of the base are a first end and a second end. Two ends of an extension direction of the first connecting arm are a first connecting end and a second connecting end. The first connecting end is connected to the base. The second connecting end is connected to the first door plate. The first connecting end and the base, and/or the second connecting end and the first door plate have a rotational degree of freedom therebetween. In a first direction, a distance between a center of the second connecting end and the first end is greater than a distance between a center of the first connecting end and the first end, where the first direction is parallel to a rotating axis of the first door plate.

16 Claims, 15 Drawing Sheets

(58) Field of Classification Search
CPC .... H04M 1/0216; H04M 1/026; H04M 1/022; H04M 1/0247; H04M 1/18; G06F 1/1641; G06F 1/1652; G06F 1/1681; G06F 1/1683; G06F 1/1616; G06F 1/1618
See application file for complete search history.

(56) References Cited

U.S. PATENT DOCUMENTS

| | | | | |
|---|---|---|---|---|
| 11,726,530 | B2* | 8/2023 | Kang | F16C 11/04 |
| | | | | 361/679.27 |
| 12,075,579 | B2* | 8/2024 | Jiang | H04M 1/0268 |
| 2020/0329574 | A1 | 10/2020 | Lee | |
| 2021/0076520 | A1 | 3/2021 | Yen et al. | |
| 2022/0104370 | A1* | 3/2022 | Wu | H05K 5/0017 |

FOREIGN PATENT DOCUMENTS

| | | | |
|---|---|---|---|
| CN | 113141427 | A | 7/2021 |
| CN | 213847328 | U | 7/2021 |
| CN | 113315860 | A | 8/2021 |
| CN | 113404766 | A | 9/2021 |
| CN | 113411429 | A | 9/2021 |
| CN | 114333593 | A | 4/2022 |
| CN | 217010905 | U | 7/2022 |
| EP | 3871575 | A1 | 9/2021 |

* cited by examiner

ROTATING MECHANISM, SUPPORT APPARATUS, AND ELECTRONIC DEVICE

This application is a national stage of International Application No. PCT/CN2022/116604, filed on Sep. 1, 2022, which claims priority to Chinese Patent Application No. 202122516974.3, filed on Oct. 19, 2021. The disclosures of both of the aforementioned applications are hereby incorporated by reference in their entireties.

TECHNICAL FIELD

This application relates to the technical field of electronic devices, and in particular to, a rotating mechanism, a support apparatus, and an electronic device.

BACKGROUND

Currently, miniaturization of an electronic device can be achieved by folding the electronic device in half for easy carrying by a user. A foldable electronic device includes a first housing and a second housing that can rotate relative to each other. Due to communication and power supply requirements, a large quantity of electrical signals need to be exchanged. Electronic components in the first housing and the second housing are electrically connected by using a connector (such as a flexible circuit board). However, space inside the electronic device is limited, and consequently, a width of the connector is limited.

SUMMARY

This application provides a rotating mechanism, a support apparatus, and an electronic device, so as to improve utilization of space inside the electronic device, and can increase a width of a connector used for electrically connecting a main circuit board and a secondary circuit board in the limited space.

To achieve the foregoing objective, the following technical solutions are used in embodiments of this application:

According to a first aspect, this application provides a rotating mechanism. The rotating mechanism includes a base, a first door plate, and a first connecting arm. Two axial ends of the base are a first end and a second end. Two ends of an extension direction of the first connecting arm are a first connecting end and a second connecting end. The first connecting end is connected to the base. The second connecting end is connected to the first door plate. The first connecting end and the base and/or the second connecting end and the first door plate have a rotational degree of freedom therebetween. In a first direction, a distance between a center of the second connecting end and the first end is greater than a distance between a center of the first connecting end and the first end, where the first direction is parallel to a rotating axis of the first door plate.

According to the rotating mechanism provided in this embodiment of this application, in the first direction, the distance between the center of the second connecting end and the first end is greater than the distance between the center of the first connecting end and the first end. This increases a width of a connector located between the first connecting arm and the first end of the base, improves utilization of space inside the electronic device, and provides a greater wiring width for the connector in the limited space.

In a possible design of the first aspect, in the first direction, a minimum distance between a side wall that is of the second connecting end and that is close to the first end and the first end is greater than a minimum distance between a side wall that is of the first connecting end and that is close to the first end and the first end. Therefore, this further increases the wiring width of the connector.

In a possible design of the first aspect, the first connecting arm further includes a middle connecting section located between the first connecting end and the second connecting end, and in a second direction, the middle connecting section extends in a direction away from the first end, where the second direction is a direction that the base points to the first door plate. Therefore, it is easy to achieve that, in the first direction, the distance between the center of the second connecting end and the first end is greater than the distance between the center of the first connecting end and the first end.

In a possible design of the first aspect, in the second direction, the middle connecting section extends along a curve in the direction away from the first end.

In a possible design of the first aspect, in the second direction, the middle connecting section extends obliquely along a straight line in the direction away from the first end.

In a possible design of the first aspect, a width of the second connecting end is less than a width of the first connecting end. That is, a dimension of the second connecting end in an extension direction of a rotating axis of the first housing or the first door plate is less than a dimension of the first connecting end in the extension direction of the rotating axis of the first housing of the first door plate. This increases a distance between a fastening block and the first end of the base, and then increases the width of the connector disposed between the first fastening block and the first end of the base.

In a possible design of the first aspect, a side wall that is of the first connecting end and that is away from the first end is flush with a side wall that is of the second connecting end and that is away from the first end, and a width of the first connecting end is less than a width of the second connecting end. Therefore, this achieves that, in the first direction, the distance between the center of the second connecting end and the first end is greater than the distance between the center of the first connecting end and the first end: and this also reduces a dimension of the first fastening block in the extension direction of the rotating axis of the first door plate, increases the distance between the first fastening block and the first end of the base, and then increases the width of the connector disposed between the first fastening block and the first end of the base.

In a possible design of the first aspect, in the second direction, a width of the first connecting arm is gradually reduced. The structure is simple, and processing is easy.

In a possible design of the first aspect, in the second direction, a side wall that is of the first connecting arm and that is close to the first end extends in a direction away from the first end, and a side wall that is of the first connecting arm and that is away from the first end is parallel to an end face of the first end. The structure is simple, and processing is easy.

In a possible design of the first aspect, the first connecting end is rotatably connected to the base, and the second connecting end is rotatably and/or slidably connected to the first door plate.

In a possible design of the first aspect, the rotating mechanism further includes a second door plate and a second connecting arm. The second door plate and the first door plate are respectively disposed on two opposite sides of the base. The second door plate is rotatably connected to the base. The second connecting arm and the first connecting arm are spaced apart in an axial direction of the base, and the second connecting arm is located on a side that is of the first connecting arm and that is away from the first end. Two ends of an extension direction of the second connecting arm are a third connecting end and a fourth connecting end. The third connecting end is connected to the base. The fourth connecting end is connected to the second door plate. The third connecting end and the base and/or the fourth connecting end and the second door plate have a rotational degree of freedom therebetween. In the first direction, a distance between a center of the fourth connecting end and the second end is greater than a distance between a center of the third connecting end and the second end.

Therefore, this increases the width of the connector located between the second connecting arm and the second end of the base, improves the utilization of the space inside the electronic device, and provides a greater wiring width for the connector in the limited space.

In a possible design of the first aspect, in the first direction, a minimum distance between the fourth connecting end and the second end is greater than a minimum distance between a side wall that is of the third connecting end and that is close to the second end and the second end. Therefore, this further increases the wiring width of the connector.

In a possible design of the first aspect, the second connecting arm further includes a middle connecting section located between the third connecting end and the fourth connecting end, and in a third direction, the middle connecting section extends in a direction away from the second end, where the third direction is a direction that the base points to the second door plate. Therefore, this achieves that, in the first direction, the distance between the center of the fourth connecting end and the second end is greater than the distance between the center of the third connecting end and the second end.

In a possible design of the first aspect, a side wall that is of the third connecting end and that is away from the second end is flush with a side wall that is of the fourth connecting end and that is away from the second end, and a width of the third connecting end is less than a width of the fourth connecting end. Therefore, this achieves that, in the first direction, the distance between the center of the fourth connecting end and the second end is greater than the distance between the center of the third connecting end and the second end: and this also reduces a dimension of a second fastening block in the extension direction of the rotating axis of the second door plate, increases the distance between the first fastening block and the second end of the base, and then increases the width of the connector disposed between the first fastening block and the second end of the base.

In a possible design of the first aspect, in the third direction, a width of the second connecting arm is gradually reduced. The structure is simple, and processing is easy.

In a possible design of the first aspect, in the third direction, a side wall that is of the second connecting arm and that is close to the second end extends in a direction away from the second end, and a side wall that is of the second connecting arm and that is away from the second end is parallel to an end face of the second end. The structure is simple, and processing is easy.

In a possible design of the first aspect, the second connecting end is rotatably connected to the base, and the second connecting end is rotatably and/or slidably connected to the second door plate.

In a possible design of the first aspect, in the first direction, a minimum distance between a side wall that is of the fourth connecting end and that is close to the first end and the first end is greater than a minimum distance between a side wall that is of the first connecting end and close to the first end and the first end. In this way, the fourth connecting end or the second fastening block connected to the fourth connecting end can be prevented from causing interference in assembly of a first flexible circuit board, which increases a width of the first flexible circuit board.

In a possible design of the first aspect, in the first direction, a minimum distance between a side wall that is of the second connecting end and that is close to the second end and the second end is greater than the minimum distance between the side wall that is of the third connecting end and that is close to the second end and the second end. That is, in the first direction, the side wall that is of the second connecting end and that is close to the second end is located on a side of the side wall that is of the third connecting end and that is close to the second end, the side being away from the second end.

In a possible design of the first aspect, in the first direction, the minimum distance between the side wall that is of the fourth connecting end and that is close to the first end and the first end is greater than or equal to a minimum distance between the side wall that is of the second connecting end and that is away from the first end and the first end. In this way, the fourth connecting end or the second fastening block can be further prevented from causing interference in assembly of the first flexible circuit board, which increases the width of the first flexible circuit board.

In a possible design of the first aspect, in the first direction, a distance between the side wall that is of the first connecting end and that is away from the first end and a side wall that is of the third connecting end and that is close to the first end is greater than or equal to a distance between the side wall that is of the second connecting end and that is away from the first end and the side wall that is of the fourth connecting end and that is close to the first end. In this way, the distance between the second connecting end and the first end can be increased, which increases the distance between the first fastening block and the first end, and then increases the width of the first flexible circuit board; in addition, the first fastening block can be prevented from affecting assembly of a second flexible circuit board, which increases the width of the second flexible circuit board.

According to a second aspect, this application provides a support apparatus. The support apparatus is configured to support a foldable screen. The support apparatus includes a rotating mechanism, a first housing, and a second housing. The rotating mechanism is the rotating mechanism according to any one of the foregoing technical solutions. The first housing is disposed on one side of the rotating mechanism, and is connected to the first door plate. The second housing is disposed on the other side of the rotating mechanism, and the second housing is rotatably connected to the rotating mechanism.

In a possible design of the second aspect, the first housing and the first door plate are of an integrated structure.

Because the support apparatus provided in this embodiment of this application includes the rotating mechanism according to any one of the foregoing technical solutions, the support apparatus and the rotating mechanism can resolve the same technical problem and achieve the same effect.

According to a third aspect, this application provides an electronic device, including a support apparatus and a foldable screen. The support apparatus is the support apparatus according to any one of the foregoing technical solutions. The foldable screen is attached to one side surface of the support apparatus.

Because the electronic device provided in this embodiment of this application includes the support apparatus according to the foregoing technical solution, the two can resolve the same technical problem and achieve the same effect.

100. Electronic device:
10. Foldable screen: 11. First part: 12. Second part: 13. Third part:
20. Support apparatus: 21. First housing: 211. First middle frame: 212. First back cover; 22. Second housing: 221. Second middle frame: 222, Second back cover:
23. Rotating mechanism: 230. Base: 2301. First end: 2302. Second end: 230a. First pivoting shaft: 230b. First mounting groove: 231. First door plate: 232. First connecting arm: 2321. First connecting end: 2321a. First pivoting hole: 2321b. Third pivoting shaft: 2322. Second connecting end: 2322a. Second pivoting hole: 2323. Middle connecting section: 233. First fastening block: 233a. Second pivoting shaft: 233b. Second mounting groove: 233c. First chute: 233d. Pivoting groove: 234. Second door plate: 235. Second connecting arm; 2351. Third connecting end: 2352. Fourth connecting end: 236. Second fastening block: 237. First limiting structure: 238. Second limiting structure:
30. Main circuit board:
40. Connector; 41. First flexible circuit board; and 42. Second flexible circuit board.

DESCRIPTION OF EMBODIMENTS

In embodiments of this application, the terms "first", "second", "third" and "fourth" are used for descriptive purposes only, and cannot be construed as indicating or implying relative importance or implicitly indicating a quantity of indicated technical features. Therefore, features defined with "first", "second", "third" and "fourth" may explicitly or implicitly include one or more of the features.

In embodiments of this application, the term "including", "containing" or any other variant thereof is intended to cover non-exclusive inclusion, so that a process, method, article or apparatus including a series of elements includes not only those elements, but also other elements not explicitly listed, or elements inherent to such a process, method, article or apparatus. Without further limitation, the element defined by the sentence "including a . . . " does not exclude that other identical elements are also present in the process, method, article or apparatus including the element.

In embodiments of this application, the term "and/or" is only used to describe an association relationship between associated objects, and indicates that three relationships may exist. For example, A and/or B may indicate the following: Only A exists, both A and B exist, and only B exists. In addition, the symbol "/" in this specification usually indicates an "or" relationship between the associated objects.

This application provides an electronic device. The electronic device is an electronic device with a foldable screen. Specifically, the electronic device includes, but is not limited to, a mobile phone, a tablet personal computer (tablet personal computer), a laptop computer (laptop computer), a personal digital assistant (personal digital assistant, PDA), a personal computer, a notebook computer (notebook), a vehicle-mounted device, and a wearable device (such as a watch).

Figure 1:
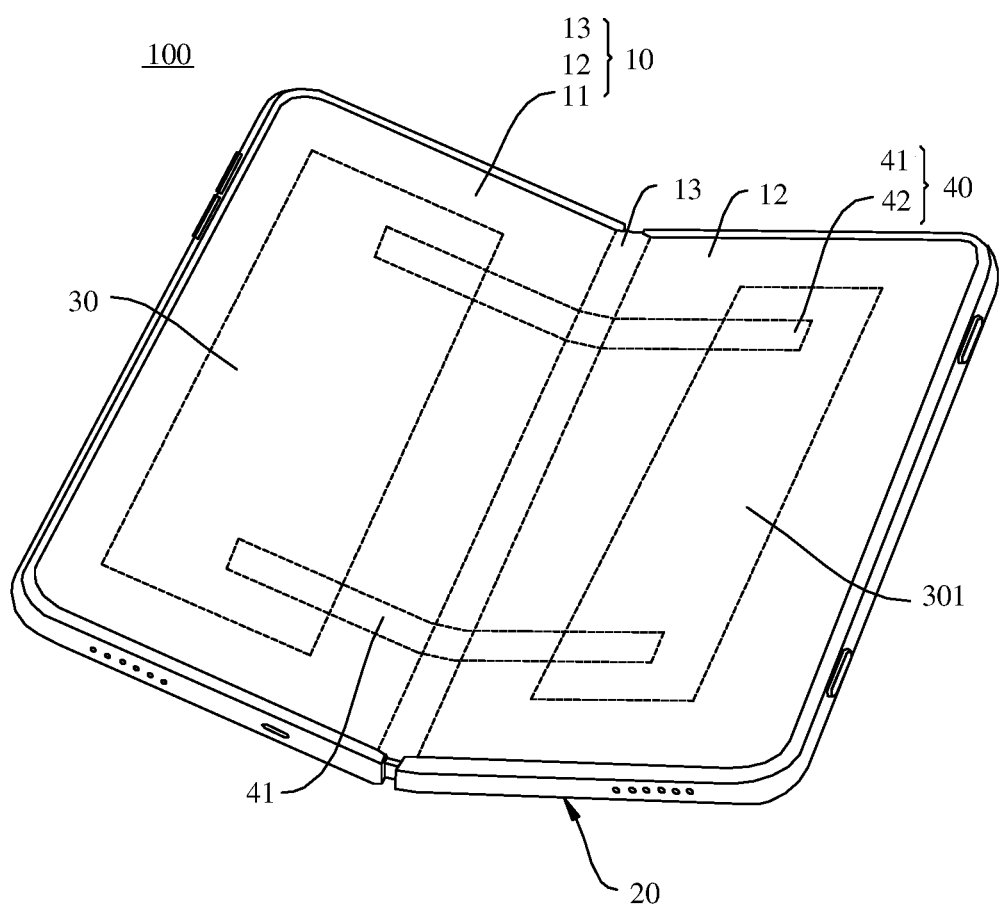
FIG. 1 is a perspective view of an electronic device according to some embodiments of this application.

Referring to FIG. 1, FIG. 1 is a perspective view of an electronic device 100 according to some embodiments of this application. In this embodiment, the electronic device 100 is a mobile phone with a foldable screen. The electronic device 100 includes a foldable screen 10, a support apparatus 20, a main circuit board 30, a secondary circuit board 301, and a connector 40, where the main circuit board 30, the secondary circuit board 301, and the connector 40 are located within the electronic device 100, and therefore outlines are shown by using dash lines.

It may be understood that FIG. 1 shows only some example components included in the electronic device 100, and actual shapes, actual sizes, actual positions, and actual structures of these components are not limited by FIG. 1.

The foldable screen 10 is configured to display an image, a video, and the like. The foldable screen 10 may be folded into a first part 11 and a second part 12. The foldable screen 10 further includes a third part 13 located between the first part 11 and the second part 12. At least the third part 13 of the foldable screen 10 is made of a flexible material. The first part 11 and the second part 12 may be made of a flexible material, or may be made of a rigid material, or part of the first part and the second part is made of a rigid material, and the other part thereof is made of a flexible material. This is not specifically limited herein.

Specifically, the foldable screen 10 may be an organic light-emitting diode (organic light-emitting diode, OLED) screen, a micro organic light-emitting diode (micro organic light-emitting diode) screen, a quantum dot light emitting diodes (quantum dot light emitting diodes, QLED) screen, a liquid crystal display (liquid crystal display, LCD), and the like.

Figure 2:
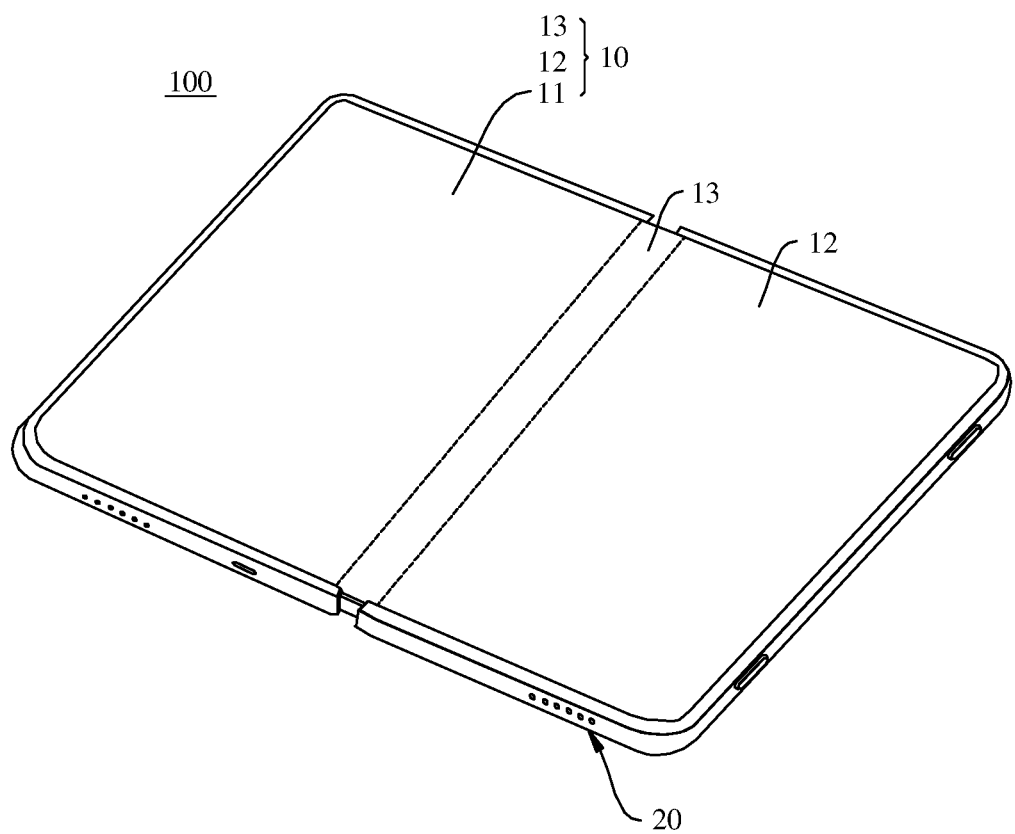
FIG. 2 is a schematic diagram of a structure of the electronic device shown in FIG. 1 when in an unfolded state.

The foldable screen 10 can be folded between an unfolded state and a folded state. Referring to FIG. 2, FIG. 2 is a schematic diagram of a structure of the electronic device 100 shown in FIG. 1 when the foldable screen 10 is in the unfolded state. When the foldable screen 10 is in the unfolded state, the first part 11, the second part 12, and the third part 13 are coplanarly disposed and face a same direction. In this state, large-screen display can be implemented, which can provide richer information to a user and improve user experience.

Figure 3:
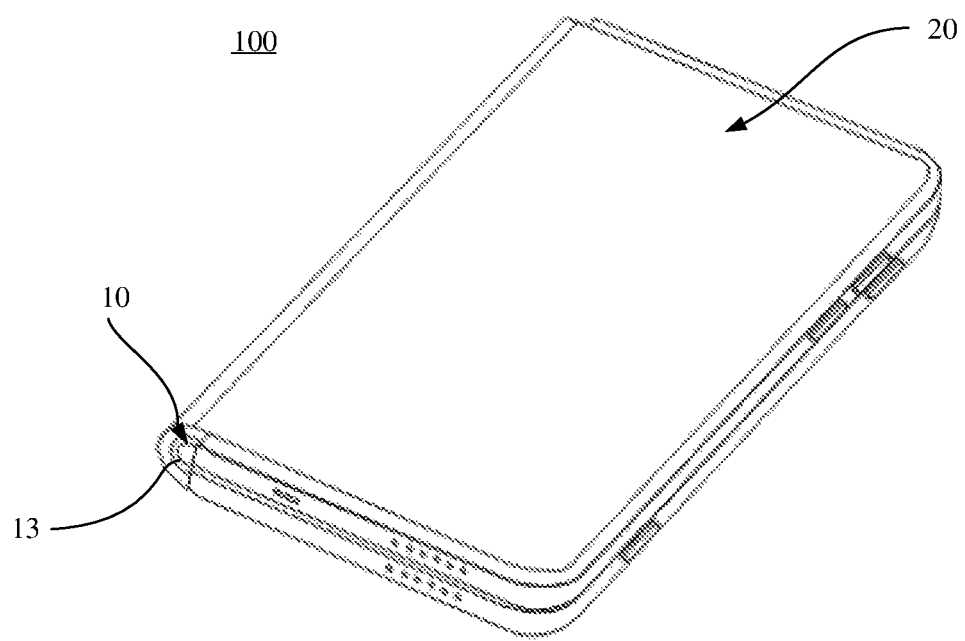
FIG. 3 is a schematic diagram of a structure of the electronic device shown in FIG. 1 when in a folded state.

Referring to FIG. 3, FIG. 3 is a schematic diagram of a structure of the electronic device 100 shown in FIG. 1 when the foldable screen 10 is in the folded state. When the foldable screen 10 is in the folded state, the third part 13 is in a bent state, and the first part 11 (not shown in FIG. 3) is opposite to the second part 12 (not shown in FIG. 3). The foldable display 10 is invisible to a user, and the support apparatus 20 is disposed outside the foldable display 10 for protection, to prevent the foldable display 10 from being scratched by hard objects. Such a foldable display phone is a phone with an inward foldable display. In other embodiments, when the foldable display is in the folded state, the first part 11 and the second part 12 may also depart from each other and be exposed. Such a foldable display phone is a phone with an outward foldable display.

Figure 4:
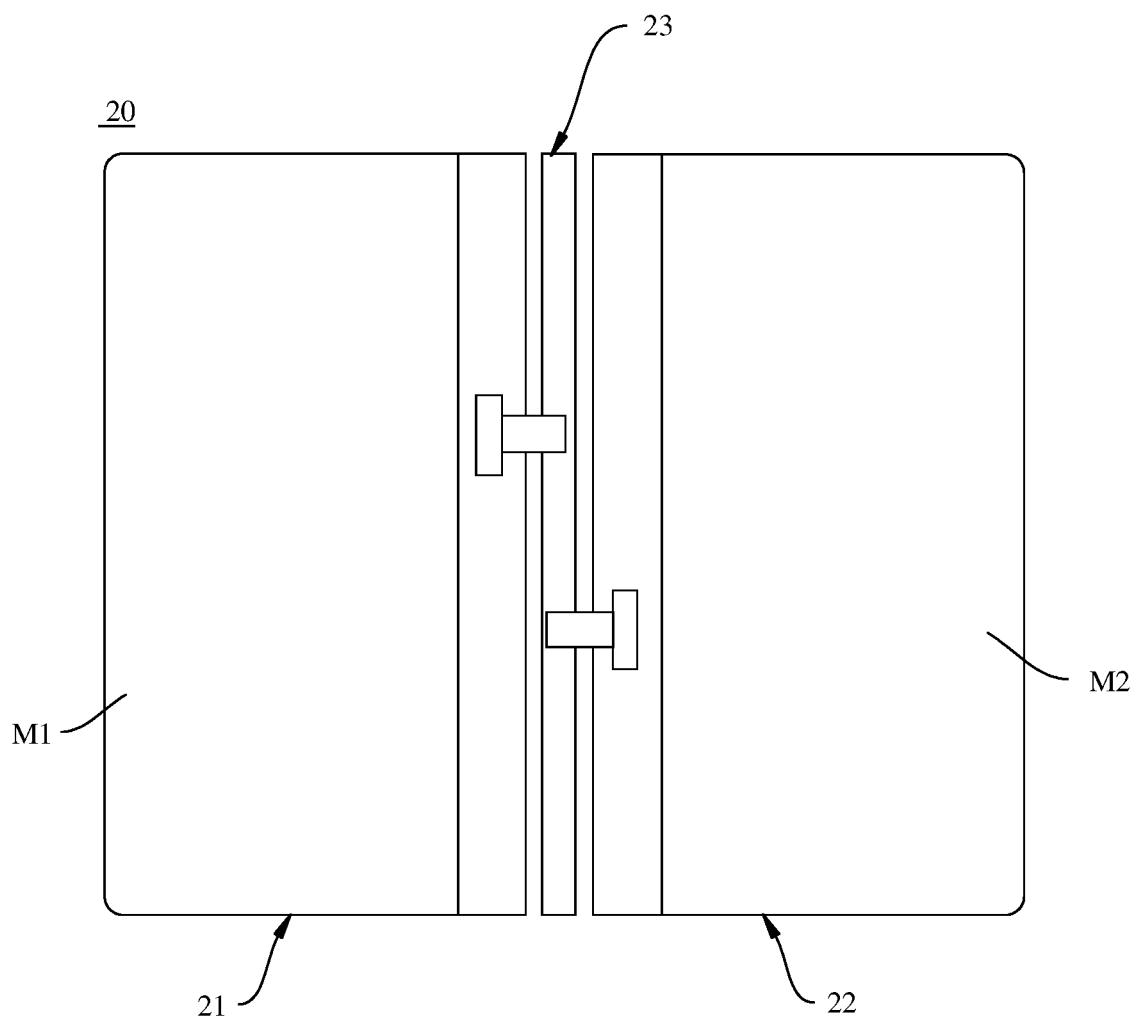
FIG. 4 is a top view of a support apparatus in the electronic device shown in FIG. 1.

The support apparatus 20 is configured to support the foldable display 10 and allow the foldable display 10 to be folded between the unfolded state and the folded state. Referring to FIG. 4, FIG. 4 is a top view of the support apparatus 20 in the electronic device 100 shown in FIG. 1. In this embodiment, the support apparatus 20 includes a first housing 21, a second housing 22, and a rotating mechanism 23. It may be understood that FIG. 4 only shows an example of some components included in the support apparatus 20, and actual shapes, sizes, locations and constructions of these components are not limited by FIG. 4.

The first housing 21 is disposed on one side of the rotating mechanism 23, and the first housing 21 is rotatably connected to the rotating mechanism 23. The first housing 21 is configured to fasten and support the first part 11 of the foldable screen 10 in FIG. 1. Specifically, the first housing 21 has a lamination surface M1, and the first housing 21 is configured to fasten and support the first part 11 of the foldable screen 10 in FIG. 1 by using the lamination surface M1.

The second housing 22 is disposed on the other side of the rotating mechanism 23, and the first housing 21 is rotatably connected to the rotating mechanism 23. The second housing 22 is configured to fasten and support the second part 12 of the foldable screen 10 in FIG. 1. Specifically, the second housing 22 has a lamination surface M2, and the second housing 22 is configured to fasten and support the second part 12 of the foldable screen 10 in FIG. 1 by using the lamination surface M2.

A first accommodating cavity (not shown in the figure) is formed inside the first housing 21. A second accommodating cavity (not shown in the figure) is formed inside the second housing 22. The main circuit board 30 and the secondary circuit board 301 of the electronic device 100 are accommodated into the first accommodating cavity and the second accommodating cavity, respectively. Specifically, the main circuit board 30 is accommodated into the first accommodating cavity, and the secondary circuit board 301 is accommodated into the second accommodating cavity. In some further embodiments, the main circuit board 30 may alternatively be accommodated into the second accommodating cavity, and the secondary circuit board 301 is accommodated into the first accommodating cavity.

The first housing 21 may be of an integrated structure, or may be formed by assembling a plurality of parts. Similarly, the second housing 22 may be an integrated mechanical part, or may be formed by assembling a plurality of parts.

Figure 5:
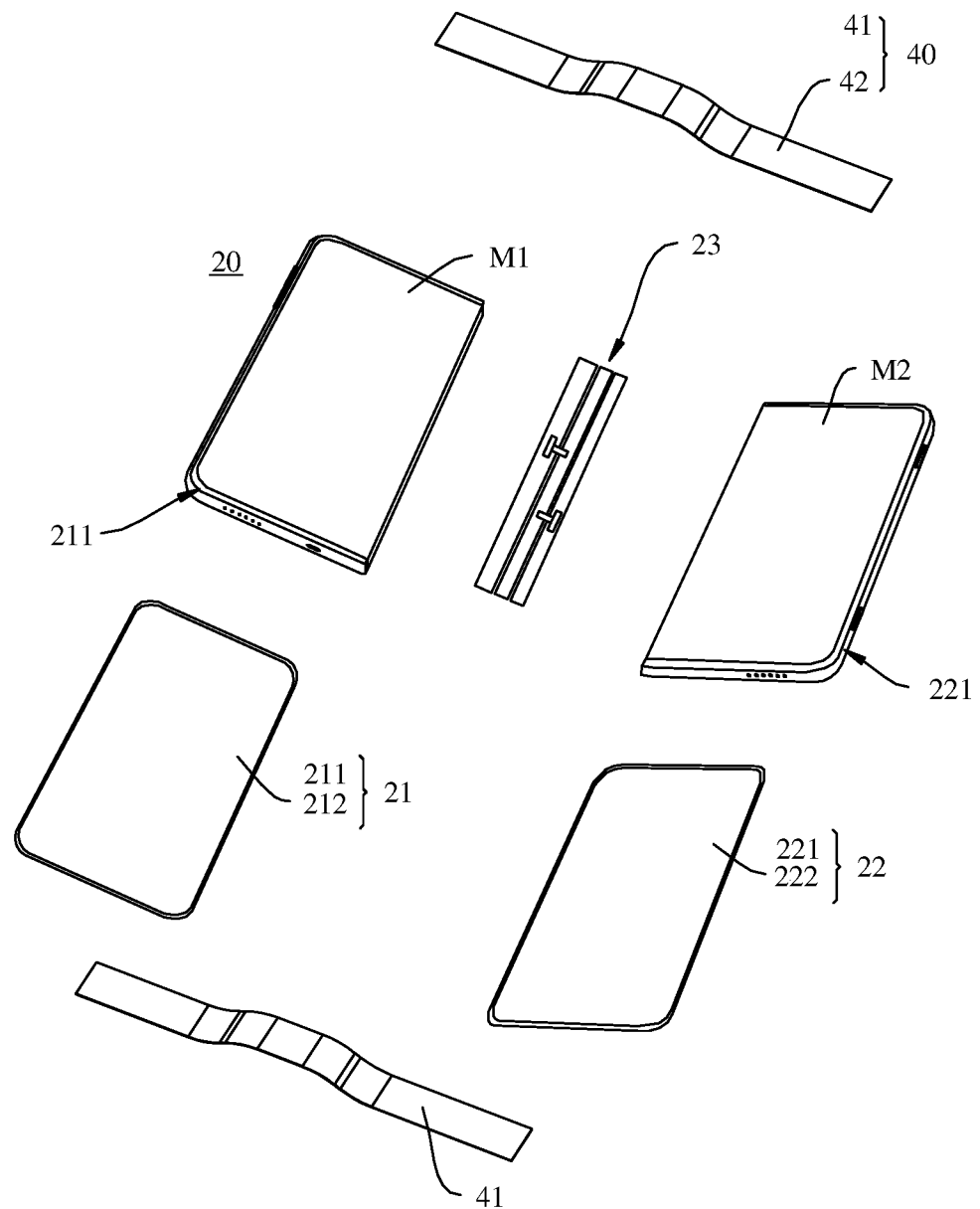
FIG. 5 is an exploded view of the support apparatus shown in FIG. 4.

In some embodiments, referring to FIG. 5, FIG. 5 is an exploded view of the support apparatus 20 shown in FIG. 4. The first housing 21 includes a first middle frame 211 and a first back cover 212. A lamination surface M1 is located on the first middle frame 211. The first back cover 212 is fastened to a side that is of the first middle frame 211 and that is away from the lamination surface M1. The first accommodating cavity is formed between the first middle frame 211 and the first back cover 212.

The second housing 22 includes a second middle frame 221 and a second back cover 222. The lamination surface M2 is located on the second middle frame 221. The second back cover 222 is fastened to a side that is of the second middle frame 221 and that is away from the lamination surface M2. The second accommodating cavity is formed between the second middle frame 221 and the second back cover 222.

The rotating mechanism 23 is configured to support the third part 13 of the foldable screen 10. In addition, the rotating mechanism 23 is connected between the first housing 21 and the second housing 22, and the first housing 21 is rotatably connected to the second housing 22 by using the rotating mechanism 23. In some embodiments, the rotating mechanism 23 is connected between the first middle frame 211 of the first housing 21 and the second middle frame 221 of the second housing 22. In other embodiments, the rotating mechanism 23 may alternatively be connected between the first back cover 212 of the first housing 21 and the second back cover 222 of the second housing 22.

Figure 6:
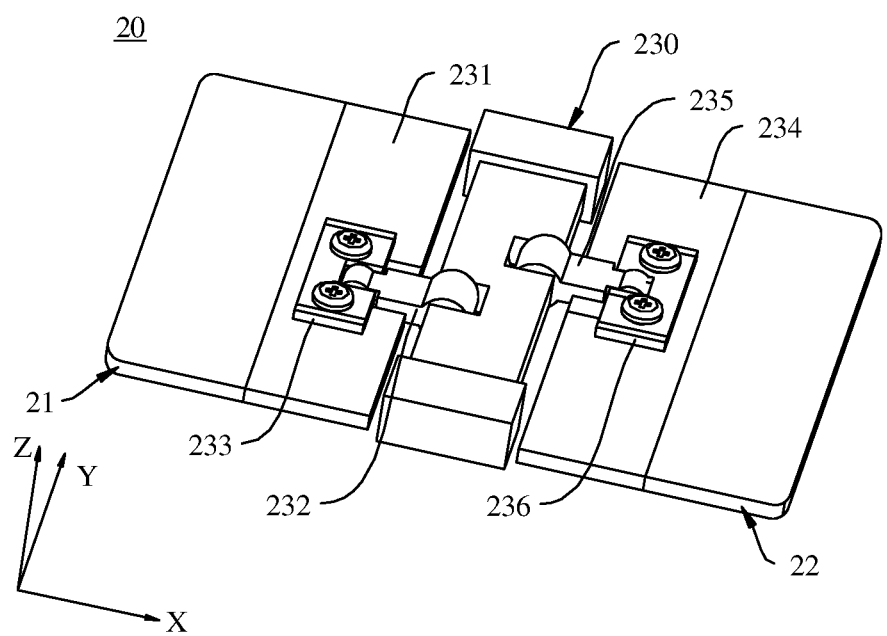
FIG. 6 is a schematic diagram of an assembly structure of a first housing, a second housing, and a rotating mechanism in a support apparatus according to some embodiments of this application.
Figure 7:
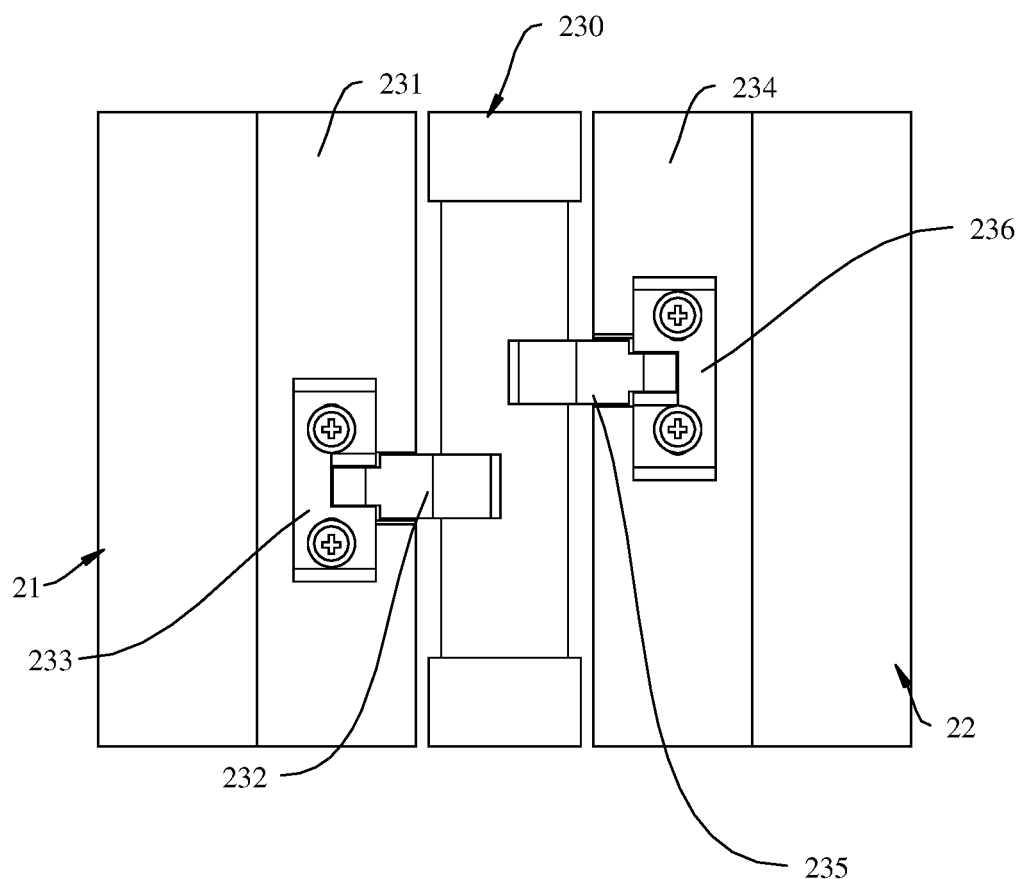
FIG. 7 is a top view of the assembly structure shown in FIG. 6.

Referring to FIG. 6 and FIG. 7, FIG. 6 is a schematic diagram of an assembly structure of a first housing 21, a second housing 22, and a rotating mechanism 23 in a support apparatus 20 according to some embodiments of this application, and FIG. 7 is a top view of the schematic diagram of the assembly structure shown in FIG. 6. In this embodiment, the rotating mechanism 23 includes a base 230, a first door plate 231, a first connecting arm 232, a first fastening block 233, a second door plate 234, a second connecting arm 235, and a second fastening block 236. It may be understood that FIG. 6 and FIG. 7 show only some example components included in the rotating mechanism 23, and actual shapes, actual sizes, actual positions, and actual structures of these components are not limited by FIG. 6 and FIG. 7.

To facilitate description of each embodiment below, an XYZ coordinate system is established for the base 230. Specifically, an axial direction of the base 230 is defined as the Y axis direction, that is, an extension direction of a rotating axis of the first housing 21 or the first door plate 231 is the Y axis direction: a thickness direction of the base 230 is the Z axis direction: and a direction perpendicular to the Y axis direction and the Z axis direction is the X axis direction. It may be understood that the coordinate system for the base 230 may be flexibly set based on actual needs. This is not specifically limited herein.

Referring to FIG. 6 and FIG. 7, the first door plate 231 and the second door plate 234 are disposed on two opposite sides of the base 230. The first door plate 231 and the second door plate 234 can rotate relative to the base 230. The first door plate 231 is connected to the first housing 21, and the second door plate 234 is connected to the second housing 22.

Still referring to FIG. 6 and FIG. 7, rotational connection and motion constraint are implemented between the first door plate 231 and the base 230 by using the first connecting arm 232. Connection and motion constraint are implemented between the second door plate 234 and the base 230 by using the second connecting arm 235. Specifically, the first fastening block 233 is fastened on the first door plate 231, the second fastening block 236 is fastened on the second door plate 234, and the first connecting arm 232 is connected to the first door plate 231 by using the first fastening block 233. The second connecting arm 235 is connected to the second door plate 234 by using the second fastening block 236. This facilitates assembly of the first connecting arm 232 and the first door plate 231, reduces assembly difficulty, and improves assembly efficiency.

The main circuit board 30 is configured to integrate a control chip, and is electrically connected to electronic components such as a foldable screen 10, a camera module, or a receiver. The control chip may be, for example, an application processor (application processor, AP), a double data rate synchronous dynamic random access memory (double data rate, DDR) and a universal flash storage (universal flash storage, UFS).

The main circuit board 30 may be a rigid circuit board, may be a flexible circuit (flexible printed circuit, FPC) board, or may be a flexible-rigid circuit board. The main circuit board 30 may be an FR-4 dielectric board, may be a Rogers dielectric board, may be an FR-4+Rogers mixed dielectric board, or the like. Here, FR-4 is a flame-resistant material grade code, and the Rogers dielectric board is a high frequency board.

The secondary circuit board 301 is configured to integrate electronic parts and components such as a radio frequency front end of an antenna (such as a 5G antenna), a universal serial bus (universal serial bus, USB) device, or an oscillator. The secondary circuit board 301 may be a rigid circuit board, may be a flexible circuit board, or may be a flexible-rigid circuit board. The secondary circuit board 301 may be an FR-4 dielectric board, may be a Rogers dielectric board, may be an FR-4+Rogers mixed dielectric board, or the like.

The secondary circuit board 301 is electrically connected to the main circuit board 30 by using the connector 40, to implement data and signal transmission between the secondary circuit board 301 and the main circuit board 30, and then connect signals of related electronic components inside the first housing 21 and the second housing 22. The connector 40 may be a flexible circuit (flexible printed circuit, FPC) board, and thus can adapt to unfolding and folding of the electronic device 100.

Figure 8:
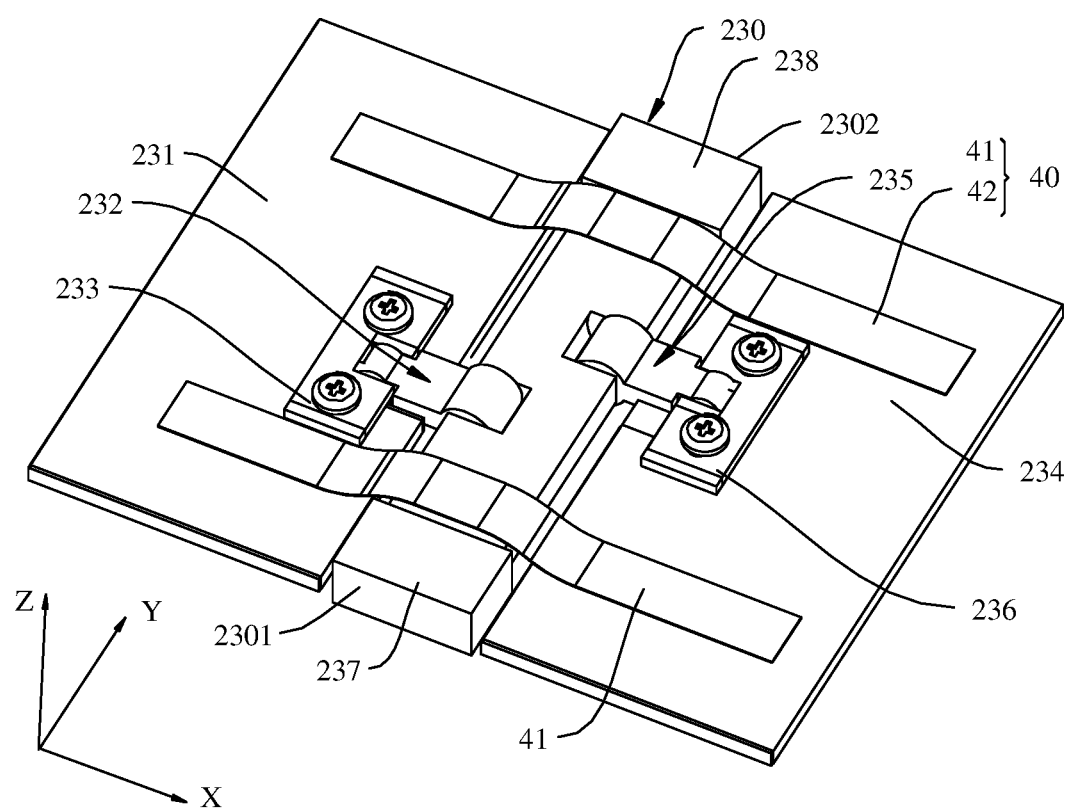
FIG. 8 is a schematic diagram of assembly of a connector and the support apparatus shown in FIG. 6.

Referring to FIG. 8, FIG. 8 is a schematic diagram of assembly of a connector 40 and the support apparatus 20 shown in FIG. 6. The connector 40 is disposed to span the rotating mechanism 23 in a direction parallel to the X axis, to connect signals of related electronic components inside the first housing 21 and the second housing 22. In other embodiments, the connector 40 may alternatively be disposed to penetrate into the rotating mechanism 23 in a direction parallel to the X axis.

In some embodiments, referring to FIG. 8, there are two connectors 40: a first flexible circuit board 41 and a second flexible circuit board 42. The first flexible circuit board 41 and the second flexible circuit board 42 are spaced apart in the axial direction of the base 230.

One axial end of the base 230 is a first end 2301, and the other axial end of the base 230 is a second end 2302. The first flexible circuit board 41 is disposed between the first fastening block 233 and the first end 2301 of the base 230. The second flexible circuit board 42 is disposed between the second fastening block 236 and the second end 2302 of the base 230. It may be understood that, in other embodiments, there may be one connector 40. The connector 40 may be disposed between the first fastening block 233 and the first end 2301 of the base 230, or the connector 40 may be disposed between the second fastening block 236 and the second end 2302 of the base 230.

In some embodiments, referring to FIG. 8, the first end 2301 of the base 230 is formed into a first limiting structure 237, and the first flexible circuit board 41 is located between the first fastening block 233 and the first limiting structure 237. The second end 2302 of the base 230 is formed into a second limiting structure 238, and the second flexible circuit board 42 is located between the second fastening block 236 and the second limiting structure 238. In some further embodiments, the first limiting structure 237 and the second limiting structure 238 may also be structures independent of the base 230.

In the foregoing embodiments, a width of the first flexible circuit board 41 is limited by a distance between the first fastening block 233 and the first limiting structure 237, and a width of the second flexible circuit board 42 is limited by a distance between the second fastening block 236 and the second limiting structure 238. The quantity of wires between the first housing 21 and the second housing 22 is relatively large due to communication requirements, the distance between the first fastening block 233 and the first limiting structure 237 and the distance between the second fastening block 236 and the second limiting structure 238 are extremely limited, and therefore the width of the first flexible circuit board 41 and the width of the second flexible circuit board 42 cannot be increased, which forms a contradiction. To resolve the foregoing contradiction, in a related technology, the connector 40 is configured as a multi-layer wiring structure, or two or more connectors 40 are stacked for wiring. But this has a negative impact on the reliability and costs of the electronic device 100. In addition, an extremely narrow wiring cross-section will lead to large resistance, which affects the performance of the electronic device 100.

Figure 9:
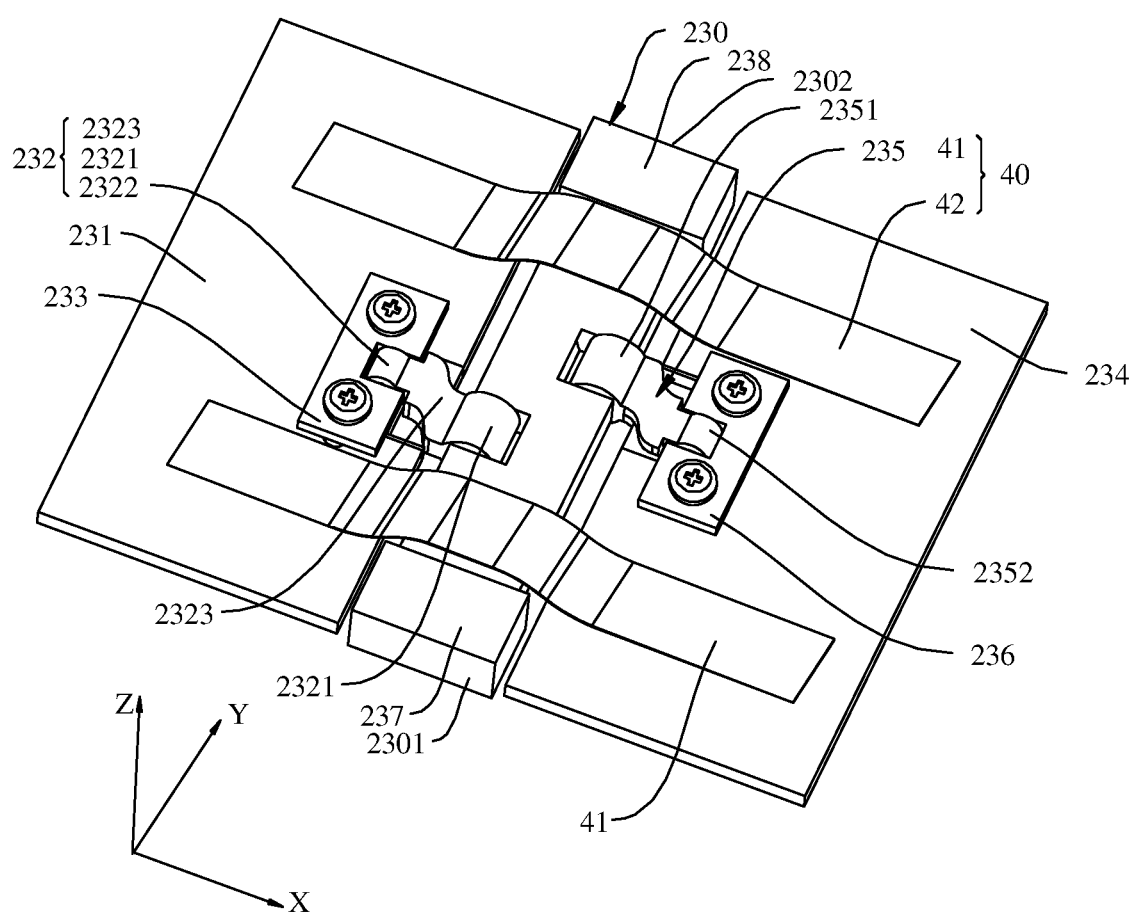
FIG. 9 is a perspective view of assembly of a rotating mechanism according to some further embodiments of this application and a connector.
Figure 10:
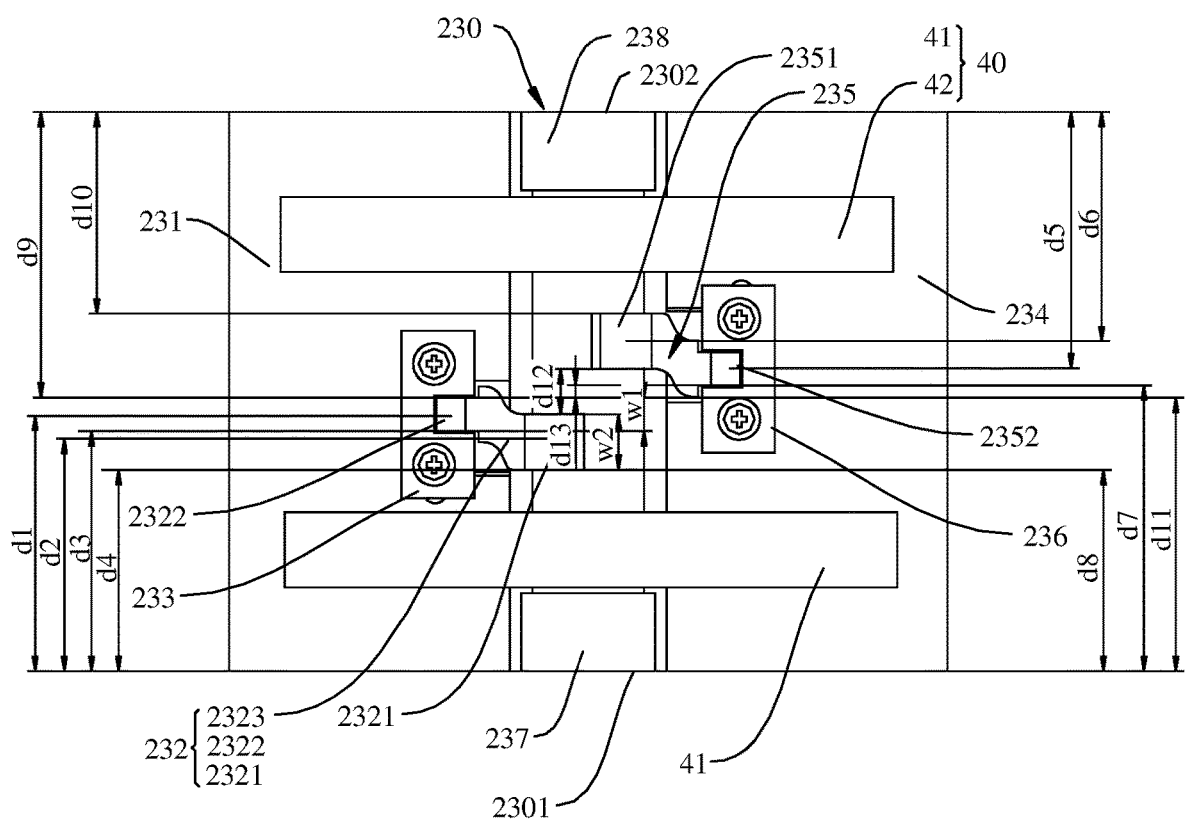
FIG. 10 is a top view of the perspective view of assembly shown in FIG. 9.

To resolve the foregoing technical problem, referring to FIG. 9 and FIG. 10, FIG. 9 is a perspective view of assembly of a rotating mechanism 23 according to some further embodiments of this application and a connector 40, and FIG. 10 is a top view of the perspective view of assembly shown in FIG. 9. In this embodiment, the rotating mechanism 23 includes a base 230, a first connecting arm 232, a first fastening block 233, a second door plate 234, a second connecting arm 235, and a second fastening block 236. It may be understood that, in other embodiments, the rotating mechanism 23 may not include the second door plate 234, the second connecting arm 235, and the second fastening block 236.

The first door plate 231 and the second door plate 234 are disposed on two opposite sides of the base 230 in the X axis direction. The first door plate 231 and the second door plate 234 are rotatably connected to the base 230. The first door plate 231 is connected to the first housing 21, and the second door plate 234 is connected to the second housing 22, to implement relative rotation of the first housing 21 and the second housing 22, so that the electronic device 100 is switched between an unfolded state and a folded state.

Specifically, the first door plate 231 and the first housing 21 are connected through gluing, threaded connection, riveting, welding, or the like: or the first door plate 231 and the first housing 21 are of an integrated structure, that is, the first door plate 231 and the first housing 21 are integrally formed. For example, the first door plate 231 and the first middle frame 211 are integrally formed. Similarly, the second door plate 234 and the second housing 22 are connected through gluing, threaded connection, riveting, welding, or the like: or the second door plate 234 and the second housing 22 are of an integrated structure, that is, the second door plate 234 and the second housing 22 are integrally formed. For example, the second door plate 234 and the second middle frame 221 are integrally formed.

Referring to FIG. 9 and FIG. 10, the first fastening block 233 is fixedly connected to the first door plate 231. For example, the first fastening block 233 may be fastened on the first door plate 231 through screwing, gluing, welding, riveting, or the like. Two ends of an extension direction of the first connecting arm 232 are a first connecting end 2321 and a second connecting end 2322, where "two ends of an extension direction of the first connecting arm 232" refers to "two ends of a length direction of the first connecting arm 232".

The first connecting end 2321 is connected to the base 230, and the second connecting end 2322 is connected to the first fastening block 233, where the first connecting end 2321 and the base 230, and/or the second connecting end 2322 and the first fastening block 233 have a rotational degree of freedom therebetween, to ensure consistence of a motion direction of the first connecting arm 232 and a rotation direction of the first housing 21 when the electronic device 100 rotates between the unfolded state and the folded state. Specifically, it may be that only the first connecting end 2321 and the base 230 have a rotational degree of freedom therebetween, may be that the second connecting end 2322 and the first fastening block 233 have a rotational degree of freedom therebetween, or may be that the first connecting end 2321 and the base 230, and the second connecting end 2322 and the first fastening block 233 have a rotational degree of freedom therebetween.

Still referring to FIG. 9 and FIG. 10, the second fastening block 236 is fixedly connected to the second door plate 234. For example, the second fastening block 236 may be fastened to the second door plate 234 through screwing, gluing, welding, riveting, or the like. Two ends of an extension direction of the second connecting arm 235 are a third connecting end 2351 and a fourth connecting end 2352, that is, two ends of a length direction of the second connecting arm 235 are respectively formed into the third connecting end 2351 and the fourth connecting end 2352.

The third connecting end 2351 is connected to the base 230, and the fourth connecting end 2352 is connected to the second fastening block 236, where the third connecting end 2351 and the base 230, and/or the fourth connecting end 2352 and the first fastening block 236 have a rotational degree of freedom therebetween, to ensure consistence of a motion direction of the first connecting arm 232 and a rotation direction of the first housing 21 when the electronic device 100 rotates between the unfolded state and the folded state. Specifically, it may be that only the third connecting end 2351 and the base 230 have a rotational degree of freedom therebetween, may be that the fourth connecting end 2352 and the first fastening block 233 have a rotational degree of freedom therebetween, or may be that the third connecting end 2351 and the base 230, and the fourth connecting end 2352 and the second fastening block 236 have a rotational degree of freedom therebetween.

It may be understood that, in other embodiments, the second connecting end 2322 of the first connecting arm 232 can also be fixedly connected to the first fastening block 233; and the first connecting end 2321 and the base 230, and/or the first door plate 231 and the first fastening block 233 have a rotational degree of freedom therebetween, provided that consistence of the motion direction of the first connecting arm 232 and the rotation direction of the first housing 21 can be ensured when the electronic device 100 rotates between the unfolded state and the folded state.

Similarly, the fourth connecting end 2352 of the second connecting arm 235 can also be fixedly connected to the second fastening block 236; and the third connecting end 2351 and the base 230, and/or the second door plate 234 and the second fastening block 236 have a rotational degree of freedom therebetween, provided that consistence of a motion direction of the second connecting arm 235 and a rotation direction of the second housing 22 can be ensured when the electronic device 100 rotates between the unfolded state and the folded state.

Figure 11:
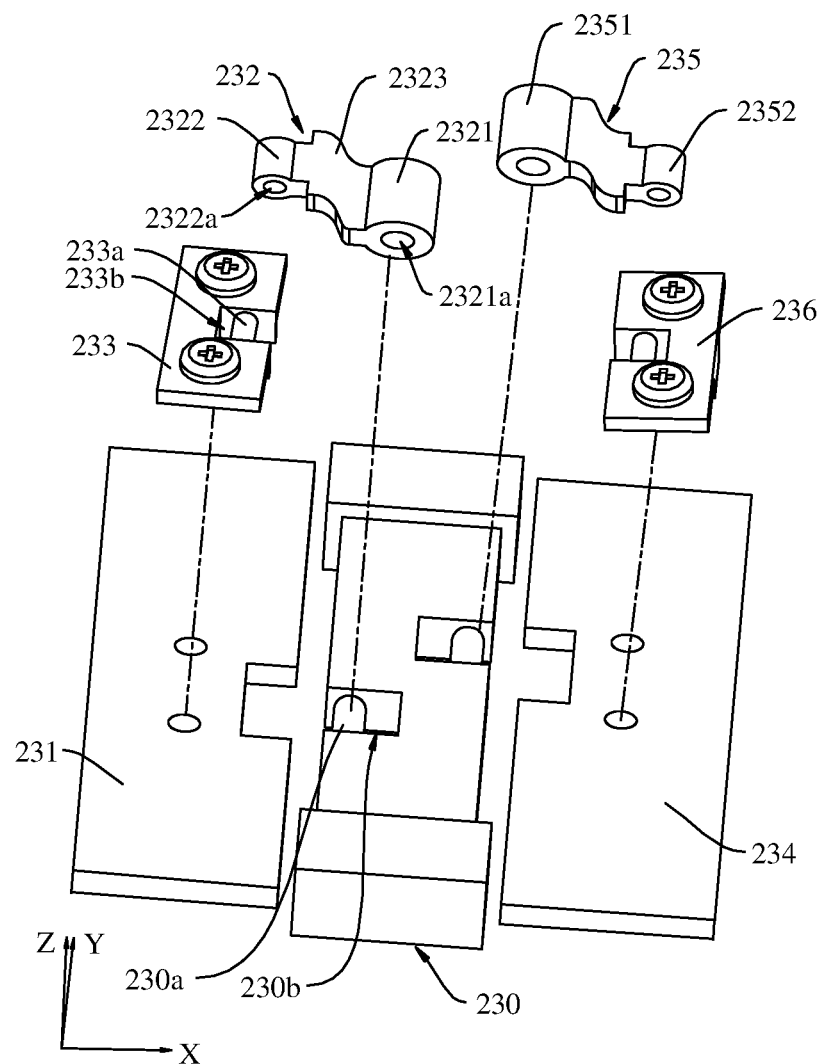
FIG. 11 is an exploded view of the rotating mechanism shown in FIG. 9.

In some embodiments, referring to FIG. 11, FIG. 11 is an exploded view of the rotating mechanism 23 shown in FIG. 9. The first connecting end 2321 is rotatably connected to the base 230, and the second connecting end 2322 is rotatably connected to the first fastening block 233. The first connecting end 2321 is provided with a first pivoting hole 2321a, and an extension direction of a central axis of the first pivoting hole 2321a is parallel to the Y axis direction. A first pivoting shaft 230a is disposed on the base 230, and a length direction of the first pivoting shaft 230a is parallel to the Y axis direction. Specifically, a first mounting groove 230b is disposed on the base 230. The first mounting groove 230b is provided with a first inner side wall and a second inner side wall that are opposite to each other in the Y axis direction, and two axial directions of the first pivoting shaft 230a are respectively disposed on the first inner side wall and the second inner side wall. Therefore, rotatable connection between the first connecting end 2321 and the base 230 can be easily implemented, and the structure is simple and processing is easy.

The second connecting end 2322 is provided with a second pivoting hole 2322a, and an extension direction of a central axis of the second pivoting hole 2322a is parallel to the Y axis direction. A second pivoting shaft 233a is disposed on the first fastening block 233, and a length direction of the second pivoting shaft 233a is parallel to the Y axis direction. Specifically, a second mounting groove 233b is disposed on the first fastening block 233. The second mounting groove 233b is provided with a third inner side wall and a fourth inner side wall that are opposite to each other in the Y axis direction, and two axial directions of the second pivoting shaft 233a are respectively disposed on the third inner side wall and the fourth inner side wall. Therefore, rotatable connection between the second connecting end 2322 and the first fastening block 233 can be easily implemented, and the structure is simple and processing is easy.

The second connecting arm 235 is connected to the second door plate 234 in the same way that the first connecting arm 232 is connected to the first door plate 231, and the second connecting arm 235 is connected to the base 230 in the same way that the first connecting arm is connected to the base 230, which is not repeated here.

Referring back to FIG. 10, in the first direction, a distance d1 between a center of the second connecting end 2322 and the first end 2301 is greater than a distance d2 between a center of the first connecting end 2321 and the first end 2301.

The first direction is parallel to a rotating axis of the first door plate. In other words, in the X axis direction, the center of the second connecting end 2322 is offset from the center of the first connecting end 2321 in a direction away from the first end 2301.

The center of the first connecting end 2321 may be a centroid, center of mass, or center of gravity of the first connecting end 2321: and correspondingly, the center of the second connecting end 2322 may be a centroid, center of mass, or center of gravity of the second connecting end 2322.

Because the second connecting end 2322 is connected to the first door plate 231 by using a first fastening block 233, in the first direction (that is in the Y axis direction), the distance between the center of the second connecting end 2322 and the first end 2301 is set to be greater than the distance d2 between the center of the first connecting end 2311 and the first end 2301, and the position of the first fastening block 233 may be moved in a direction away from the first end 2301. Therefore, the distance between the first fastening block 233 and the first end 2301 of the base 230 can be increased without changing the dimensions of the second connecting end 2322 and the first fastening block 233 in the Y axis direction, so that a width of the connector 40 (that is the foregoing first flexible circuit board 41) disposed between the first fastening block 233 and the first end 2301 of the base 230 can be increased, utilization of space inside the electronic device 100 is improved, and a greater wiring width for the connector 40 is provided in the limited space.

In the rotating mechanism 23 provided in this embodiment of this application, in the first direction, the distance between the center of the second connecting end 2322 and the first end 2301 is set to be greater than the distance d2 between the center of the first connecting end 2311 and the first end 2301, which increases the width of the connector 40 disposed between the first fastening block 233 and the first end 2301 of the base 230, the utilization of the space inside the electronic device 100 is improved, a greater wiring width for the connector 40 is provided in the limited space, the problems of high cost and high impedance caused by insufficient wiring space are resolved, and electrical connection design of the electronic device 100 is optimized.

On this basis, to further increase the distance between the first fastening block 233 and the first end 2301 of the base 230, referring to FIG. 10, in the first direction, a minimum distance d3 between a side wall that is of the second connecting end 2322 and that is close to the first end 2301 and the first end 2301 is greater than a minimum distance d4 between a side wall that is of the first connecting end 2321 and that is close to the first end 2301 and the first end 2301, that is, d3 is greater than d4.

Specifically, the first connecting arm 232 further includes a middle connecting section 2323 located between the first connecting end 2321 and the second connecting end 2322. Referring to FIG. 10, two ends of an extension direction of the middle connecting section 2323 are respectively connected to the first connecting end 2321 and the second connecting end 2322. That is, two ends of a length direction of the middle connecting section 2323 are respectively connected to the first connecting end 2321 and the second connecting end 2322. In some embodiments, in a second direction, the middle connecting section 2323 extends in a direction away from the first end 2301, where the second direction refers to a direction that the base 230 points to the first door plate 231. Referring to FIG. 9 and FIG. 10, in the second direction, the first connecting arm 232 extends along a curve in the direction away from the first end 2301. It may be understood that, in other embodiments, in the second direction, the middle connecting section 2323 may also extend obliquely along a straight line in the direction away from the first end 2301, Therefore, it is easy to achieve that, in the first direction, the distance between the center of the second connecting end 2322 and the first end 2301 is greater than the distance between the center of the first connecting end 2321 and the first end 2301.

In some embodiments, referring to FIG. 10, a width w1 of the second connecting end 2322 is less than a width w2 of the first connecting end 2321. The width w1 of the second connecting end 2322 refers to the dimension of the second connecting end 2322 in the Y axis direction, similarly, the width w2 of the first connecting end 2321 refers to the dimension of the first connecting end 2321 in the Y axis direction. Therefore, this reduces the dimension of the first fastening block 233 in the Y axis direction, increases the distance between the fastening block 233 and the first end 2301 of the base 230, and then increases the width of the connector 40 disposed between the first fastening block 233 and the first end 2301 of the base 230.

On the basis of the foregoing embodiments, still referring to FIG. 9 and FIG. 10, in the first direction, a distance d5 between a center of the fourth connecting end 2352 and the second end 2302 is greater than a distance d6 between a center of the third connecting end 2351 and the second end 2302. That is, in the X axis direction, the center of the fourth connecting end 2352 is offset from the center of the third connecting end 2351 in a direction away from the second end 2302. The center of the third connecting end 2351 may be a centroid, center of mass, or center of gravity of the third connecting end 2351: and correspondingly, the center of the fourth connecting end 2352 may be a centroid, center of mass, or center of gravity of the fourth connecting end 2352.

Because the fourth connecting end 2352 is connected to the second door plate 234 by using the second fastening block 236, in the first direction, the distance d5 between the center of the fourth connecting end 2352 and the second end 2302 is set to be greater than the distance d6 between the center of the third connecting end 2351 and the second end 2302, and the position of the second fastening block 236 may be moved in a direction away from the second end 2302. Therefore, the distance between the second fastening block 236 and the second end 2302 can be increased without changing the dimensions of the fourth connecting end 2352 and the second fastening block 236 in the Y axis direction, that is, the distance between the second fastening block 236 and the second end 2302 of the base 230 can be increased, so that the width of the connector 40 disposed between the second fastening block 236 and the second end 2302 of the base 230 can be increased, the utilization of the space inside the electronic device 100 is further improved, a greater wiring width for the connector 40 is provided in the limited space, the problems of high cost and high impedance caused by insufficient wiring space are resolved, and the electrical connection design of the electronic device 100 is optimized.

A specific structure of the second connecting arm 235 may be the same as the structure of the first connecting arm 232, or may be different from that of the first connecting arm 232, provided that the distance d5 between the center of the fourth connecting end 2352 and the second end 2302 is greater than the distance d6 between the center of the third connecting end 2351 and the second end 2302. This is not specifically limited in this application.

In some embodiments, referring to FIG. 9 and FIG. 10, the first connecting arm 232 and the second connecting arm 235 are spaced apart in the axial direction of the base 230, and the second connecting arm 235 is located on a side that is of the first connecting arm 232 and that is away from the first end 2301. In this way, interference between the first connecting arm 232 and the second connecting arm 235 can be avoided during assembly: in addition, compared with the technical solution that the first connecting arm 232 and the second connecting arm 235 are disposed opposite to each other, this solution can prevent the width of some regions on the base 230 from being too small, which is conducive to improving the entire structural strength of the base 230.

On the basis of the foregoing embodiments, referring to FIG. 10, in the first direction, a minimum distance d7 between a side wall that is of the fourth connecting end 2352 and that is close to the first end 2301 and the first end 2301 is greater than a minimum distance d8 between a side wall that is of the first connecting end 2321 and that is close to the first end 2301 and the first end 2301. That is, in the first direction, the side wall that is of the fourth connecting end 2352 and that is close to the first end 2301 is located on a side of the side wall that is of the first connecting end 2321 and that is close to the first end 2301, the side being away from the first end 2301. In this way, the fourth connecting end 2352 or the second fastening block 236 connected to the fourth connecting end 2352 can be prevented from causing interference in assembly of the first flexible circuit board 41, which increases the width of the first flexible circuit board 41.

To prevent the second connecting end 2322 or the first fastening block 233 connected to the second connecting end 2322 from causing interference in assembly of the second flexible circuit board 42, referring to FIG. 10, a minimum distance d9 between a side wall that is of the second connecting end 2322 and that is close to the second end 2302 and the second end 2302 is greater than a minimum distance d10 between a side wall that is of the third connecting end 2351 and that is close to the second end 2302 and the second end 2302. That is, in the first direction, the side wall that is of the second connecting end 2322 and that is close to the second end 2302 is located on a side of the side wall that is of the third connecting end 2351 and that is close to the second end 2302, where the side is away from the second end 2302.

Further, in some embodiments, still referring to FIG. 10, in the first direction, the minimum distance d7 between the side wall that is of the fourth connecting end 2352 and that is close to the first end 2301 and the first end 2301 is greater than a minimum distance d11 between a side wall that is of the second connecting end 2322 and that is away from the first end 2301 and the first end 2301. That is, the entire fourth connecting end 2352 is located on a side that is of the second connecting end 2322 and that is away from the first end 2301. In this way, the fourth connecting end 2352 or the second fastening block 236 can be further prevented from causing interference in the assembly of the first flexible circuit board 41, which increases the width of the first flexible circuit board 41.

It may be understood that, in other embodiments, in the first direction, the minimum distance d7 between the side wall that is of the fourth connecting end 2352 and that is close to the first end 2301 and the first end 2301 may also be equal to the minimum distance d11 between the side wall that is of the second connecting end 2322 and that is away from the first end 2301 and the first end 2301. In this case, the side wall that is of the fourth connecting end 2352 and that is close to the first end 2301 may be flush with the side wall that is of the second connecting end 2322 and that is away from the first end 2301.

On the basis of the foregoing embodiments, referring to FIG. 10, in the first direction, a distance d12 between a side wall that is of the first connecting end 2321 and that is away from the first end 2301 and a side wall that is of the third connecting end 2351 and that is close to the first end 2301 is greater than a distance d13 between the side wall that is of the second connecting end 2322 and that is away from the first end 2301 and the side wall that is of the fourth connecting end 2352 and that is close to the first end 2301. In this way, a distance between the second connecting end 2322 and the first end 2301 can be increased, which increases the distance between the first fastening block 233 and the first end 2301, and then increases the width of the first flexible circuit board 41: in addition, the first fastening block 233 can be prevented from affecting assembly of the second flexible circuit board 42, which increases the width of the second flexible circuit board 42.

In other embodiments, in the first direction, the distance d12 between the side wall that is of the first connecting end 2321 and that is away from the first end 2301 and the side wall that is of the third connecting end 2351 and that is close to the first end 2301 may alternatively be equal to the distance d13 between the side wall that is of the second connecting end 2322 and that is away from the first end 2301 and the side wall that is of the fourth connecting end 2352 and that is close to the first end 2301. In this way, the distance between the second connecting end 2322 and the first end 2301 can also be increased, which increases the distance between the first fastening block 233 and the first end 2301, and then increases the width of the first flexible circuit board 41: and the first fastening block 233 is prevented from affecting assembly of the second flexible circuit board 42, which increases the width of the second flexible circuit board 42.

Figure 12:
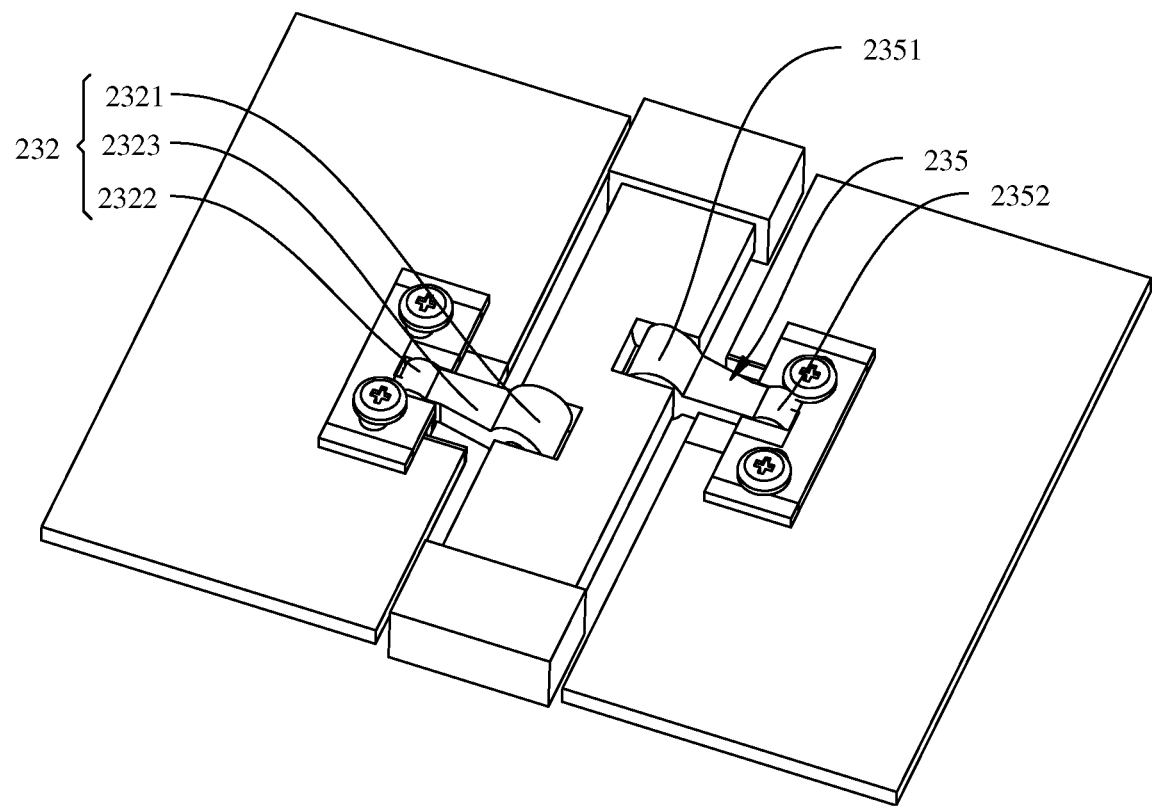
FIG. 12 is a perspective view of a rotating mechanism according to some further embodiments of this application.
Figure 13:
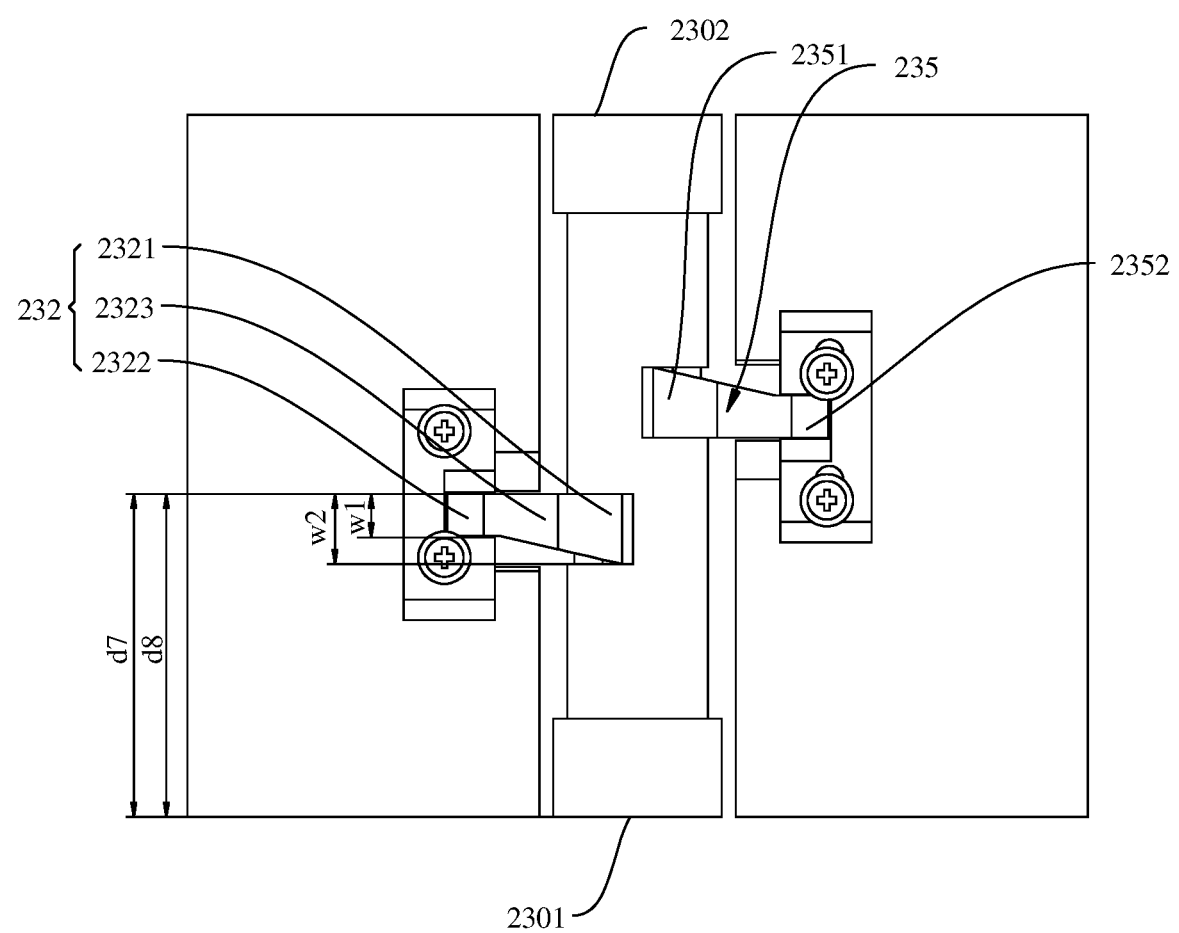
FIG. 13 is a top view of the rotating mechanism shown in FIG. 12.

In some further embodiments, referring to FIG. 12 and FIG. 13, FIG. 12 is a perspective view of a rotating mechanism 23 according to some further embodiments of this application, and FIG. 13 is a top view of the perspective view in FIG. 12. The rotating mechanism 23 in this embodiment differs from the rotating mechanism 23 shown in FIG. 9 in that: In this embodiment, the side wall that is of the first connecting end 2321 and that is away from the first end 2301 is flush with the side wall that is of the second connecting end 2322 and that is away from the first end 2301, and the width of the second connecting end 2321 is less than the width of the first connecting end 2322. It should be noted that "the side wall that is of the first connecting end 2321 and that is away from the first end 2301 is flush with the side wall that is of the second connecting end 2322 and that is away from the first end 2301" means that, in the axial direction of the base 230, the distance d7 between the side wall that is of the first connecting end 2321 and that is away from the first end 2301 and the first end 2301 is equal to the distance d8 between the side wall that is of the second connecting end 2322 and that is away from the first end 2301 and the first end 2301.

Therefore, this achieves that, in the first direction, the distance between the center of the second connecting end 2322 and the first end 2301 is greater than the distance between the center of the first connecting end 2321 and the first end 2301, so that in the X axis direction, the center of the second connecting end 2322 is offset from the center of the first connecting end 2321 in a direction away from the first end 2301: and this reduces the dimension of the first fastening block 233 in the Y axis direction, increases the distance between the first fastening block 233 and the first end 2301 of the base 230, and then increases the width of the connector 40 disposed between the first fastening block 233 and the first end 2301 of the base 230.

For example, referring to FIG. 13, in the second direction, the middle connecting section 2323 extends along a straight line, and a width of the middle connecting section 2323 is gradually reduced. Specifically, in the second direction, a side wall that is of the first connecting arm 232 and that is close to the first end 2301 extends obliquely in a direction away from the first end 2301, and a side wall that is of the first connecting arm 232 and that is away from the first end 2301 is parallel to an end face of the first end 2301. The structure is simple, and processing is easy.

It should be noted that "a width of the first connecting arm 232" in this application refers to the dimension of the first connecting arm 232 in the Y axis direction, that is, the dimension of the first connecting arm 232 in an extension direction of a rotating axis of the first housing 21 or the first door plate 231.

Figure 14:
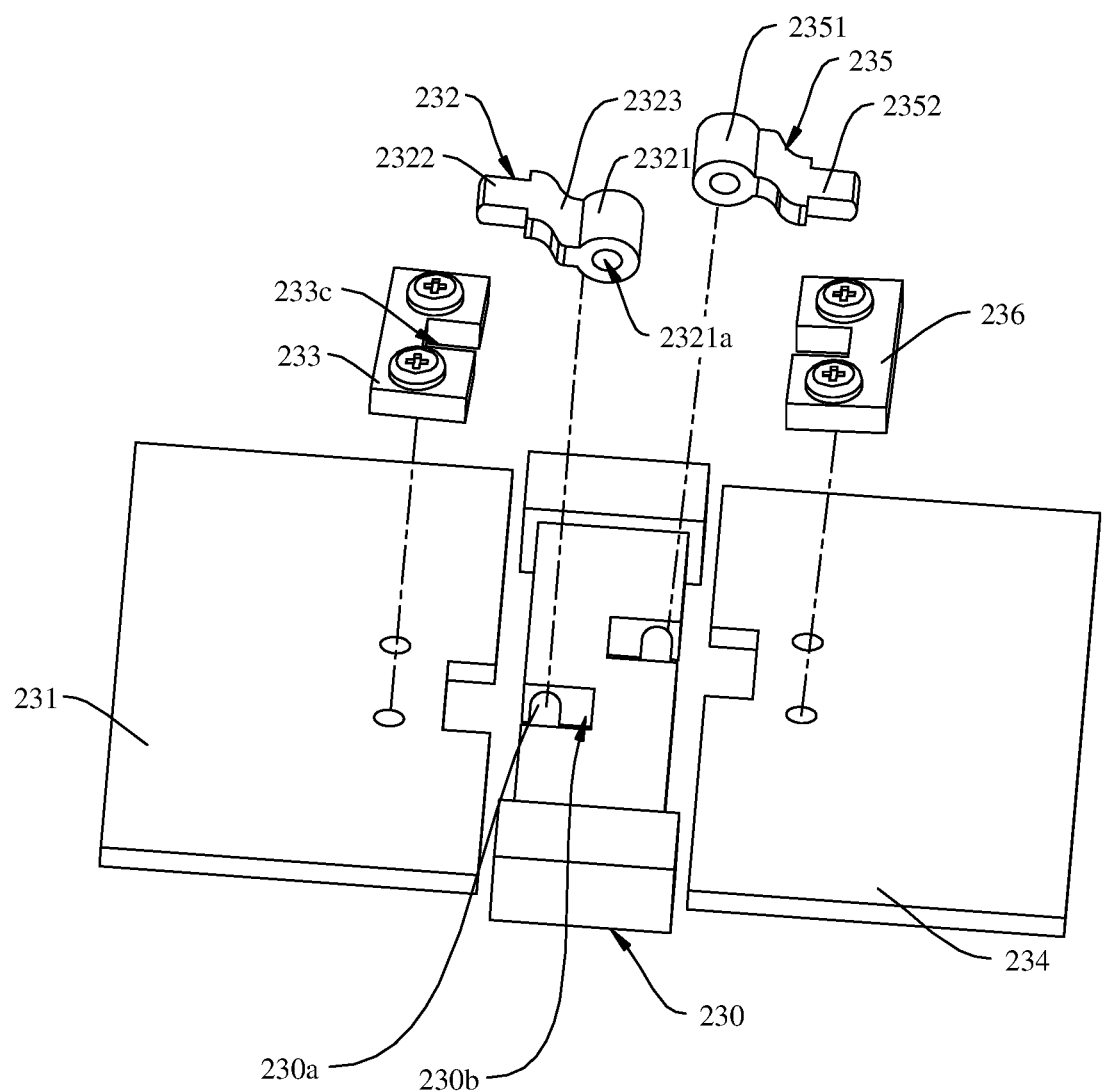
FIG. 14 is an exploded view of a rotating mechanism according to some further embodiments of this application.

In some further embodiments, referring to FIG. 14, FIG. 14 is an exploded view of a rotating mechanism 23 according to some further embodiments of this application. The rotating mechanism 23 in this embodiment differs from the rotating mechanism 23 shown in FIG. 11 in that: In this embodiment, the second connecting end 2322 of the first connecting arm 232 is slidably connected to the first fastening block 233. Specifically, the first fastening block 233 is provided with a first chute 233c, and the first connecting end 2321 is formed into a slider shape. When the first door plate 231 rotates relative to the base 230, the first connecting end 2321 can slide in the first chute 233c. In this way, connection and motion constraint can also be implemented between the first door plate 231 and the base 230 by using the first connecting arm 232.

It should be noted that a manner in which the second connecting arm 235 is connected to the second door plate 234 is the same as the manner in which the first connecting arm 232 is connected to the first door plate 231, and a manner in which the second connecting arm 235 is connected to the base 230 is the same as the manner in which the first connecting arm 232 is connected to the base 230. Details are not described herein again.

Figure 15:
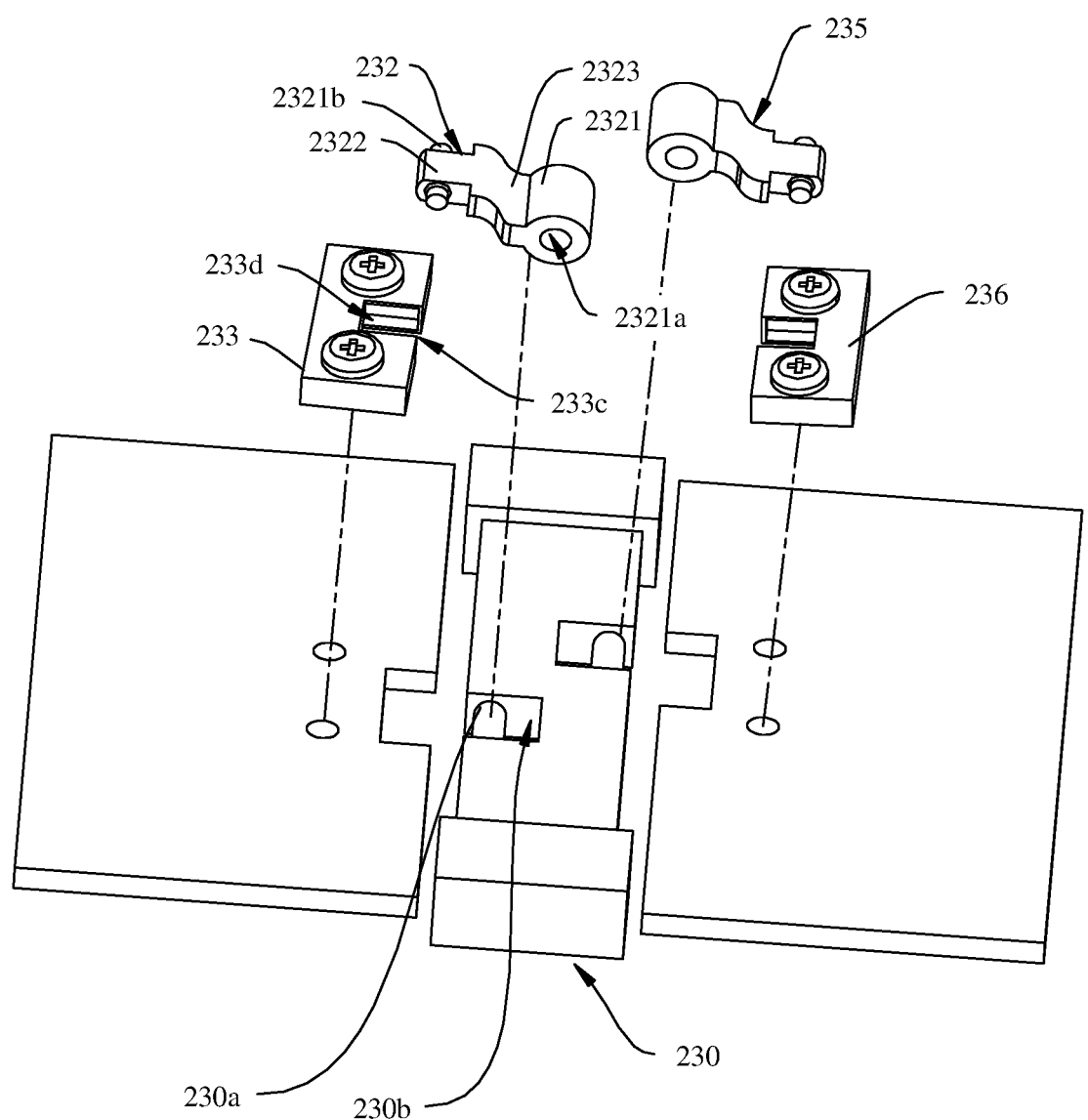
FIG. 15 is an exploded view of a rotating mechanism according to some further embodiments of this application.

In some further embodiments, referring to FIG. 15, FIG. 15 is an exploded view of a rotating mechanism 23 according to some further embodiments of this application. The rotating mechanism 23 in this embodiment differs from the rotating mechanism 23 shown in FIG. 14 in that: In this embodiment, the second connecting end 2322 of the first connecting arm 232 is slidably and rotatably connected to the first fastening block 233. In this embodiment, the first connecting end 2321 of the first connecting arm 232 is formed into a slider shape, and a third pivoting shaft 2321b is further disposed on the first connecting end 2321. In addition, in this embodiment, in addition to the first chute 233c in the embodiment shown in FIG. 14, the first fastening block 233 is further provided with a pivoting groove 233d.

Specifically, referring to FIG. 15, the first connecting end 2321 is provided with a first outer surface and a second outer surface that are opposite to each other in the Y axis, and two axial ends of the third pivoting shaft 2321b respectively protrude from the first outer surface and the second outer surface. The first chute 233c is provided with a first chute wall and a second chute wall that are opposite to each other in the Y axis, and a pivoting grooves 233d is formed in each of the first chute arm and the second chute wall. Two axial directions of the third pivoting shaft 2321b respectively extend into the pivoting groove 233d in the first chute wall and the pivoting groove 233d in the second chute wall, to implement pivoting cooperation. In this way, connection and motion constraint can also be implemented between the first door plate 231 and the base 230 by using the first connecting arm 232.

It should be noted that a manner in which the second connecting arm 235 is connected to the second door plate 234 in the same as the manner in which the first connecting arm 232 is connected to the first door plate 231, and a manner in which the second connecting arm 235 is connected to the base 230 is the same as the manner in which the first connecting arm 232 is connected to the base 230. Details are not described herein again.

In addition, in other embodiments, the second connecting end 2322 of the first connecting arm 232 may be rotatably connected to the first fastening block 233, and the first connecting end 2321 of the first connecting arm 232 can be slidably connected to the base 230, or the second connecting end 2322 of the first connecting arm 232 is rotatably connected to the first fastening block 233, and the first connecting end 2321 of the first connecting arm 232 is slidably connected to the base 230; or the second connecting end 2322 of the first connecting arm 232 is rotatably and slidably connected to the first fastening block 233, and the first connecting end 2321 of the first connecting arm 232 is slidably connected to the base 230. Provided that connection and motion constraint between the first fastening block 233 and the first door plate 231 can be implemented by using the first connecting arm 232, this application does not specifically limit the degree of freedom of motion between the first connecting arm 232 and the base 230 and the degree of freedom of motion between the first connecting arm 232 and the first door plate 231.

In the description of the specification, specific features, structures, materials or characteristics may be combined in any suitable manner in one or more embodiments or examples.

Finally, it should be noted that the foregoing embodiments are only used to illustrate the technical solutions of this application, but are not used to limit this application. Although this application has been described in detail with reference to the foregoing embodiments, it should be understood by a person of ordinary skill in the art that the technical solutions described in the foregoing embodiments may still be modified, or some technical features thereof are equivalently replaced. These modifications or replacements do not make the essence of the corresponding technical solutions depart from the scope of the technical solutions of embodiments of this application.

What is claimed is:

1. A rotating mechanism, comprising:
    a base, wherein two axial ends of the base are a first end and a second end;
    a first door plate; and
    a first connecting arm, wherein two ends of an extension direction of the first connecting arm are a first connecting end and a second connecting end, the first connecting end is connected to the base, the second connecting end is connected to the first door plate, and the first connecting end and the base have a rotational degree of freedom therebetween;
    wherein in a first direction, a distance between a center of the second connecting end and the first end is greater than a distance between a center of the first connecting end and the first end, wherein the first direction is parallel to a rotating axis of the first door plate;

wherein in the first direction, a first distance is greater than a second distance; wherein the first distance is a minimum distance between the first end and a side wall of the second connecting end and facing to the first end, and the second distance is a minimum distance between the first end and a side wall of the first connecting end facing to the first end.

2. The rotating mechanism of claim 1, wherein the first connecting arm further comprises a middle connecting section located between the first connecting end and the second connecting end; wherein in a second direction, the middle connecting section extends in a direction away from the first end, and wherein the second end is a direction that the base points to the first door plate.

3. The rotating mechanism of claim 2, wherein in the second direction, the middle connecting section extends along a curve in the direction away from the first end.

4. The rotating mechanism of claim 2, wherein in the second direction, the middle connecting section extends obliquely along a straight line in the direction away from the first end.

5. The rotating mechanism of claim 1, wherein a first side wall of the first connecting end is flush with a second side wall of the second connecting end, the first side wall is away from the first end and the second side wall is away from the first end, and a width of the first connecting end is less than a width of the second connecting end.

6. The rotating mechanism of claim 1, further comprising:
a second door plate, wherein the second door plate and the first door plate are respectively disposed on two opposite sides of the base; and
a second connecting arm, wherein the second connecting arm and the first connecting arm are spaced apart in an axial direction of the base, the second connecting arm is located on a side that is of the first connecting arm and that is away from the first end, two ends of an extension direction of the second connecting arm are a third connecting end and a fourth connecting end, the third connecting end is connected to the base, the fourth connecting end is connected to the second door plate, and the third connecting end and the base and/or the fourth connecting end and the second door plate have a rotational degree of freedom therebetween; and
in the first direction, a distance between a center of the fourth connecting end and the second end is greater than a distance between a center of the third connecting end and the second end.

7. The rotating mechanism of claim 6, wherein in the first direction, a third distance is greater than a forth distance; wherein the third distance is a minimum distance between the first end and a side wall of the fourth connecting end and facing to the first end, and the forth distance is a minimum distance between the first end and a side wall of the first connecting end facing to the first end.

8. The rotating mechanism of claim 6, wherein in the first direction, a fifth distance is greater than or equal to a sixth distance, wherein the fifth distance is a minimum distance between the first end and a side wall of the fourth connecting end and facing to the first end, and the sixth distance is a minimum distance between the first end and a side wall of the second connecting end facing away from the first end and the first end.

9. The rotating mechanism of claim 8, wherein in the first direction, a seventh distance is greater than or equal to a eighth distance; wherein the seventh distance is a distance between a side wall that is of the first connecting end and that is away from the first end and a side wall that is of the third connecting end and that faces to the first end, and the eighth distance is a distance between the side wall that is of the second connecting end and that is away from the first end and the side wall that is of the fourth connecting end and that faces to the first end.

10. A support apparatus, wherein the support apparatus is configured to support a foldable screen, and the support apparatus comprises:
a rotating mechanism;
a first housing, wherein the first housing is disposed on one side of the rotating mechanism, and is connected to a first door plate of the rotation mechanism; and
a second housing, wherein the second housing is disposed on the other side of the rotating mechanism, and the second housing being rotatably connected to the rotating mechanism;
wherein the rotating mechanism, comprising:
a base, wherein two axial ends of the base are a first end and a second end;
the first door plate; and
a first connecting arm, wherein two ends of an extension direction of the first connecting arm are a first connecting end and a second connecting end, the first connecting end is connected to the base, the second connecting end is connected to the first door plate, and the first connecting end and the base have a rotational degree of freedom therebetween;
wherein in a first direction, a distance between a center of the second connecting end and the first end is greater than a distance between a center of the first connecting end and the first end, wherein the first direction is parallel to a rotating axis of the first door plate;
wherein in the first direction, a first distance is greater than a second distance; wherein the first distance is a minimum distance between the first end and a side wall of the second connecting end and facing to the first end, and the second distance is a minimum distance between the first end and a side wall of the first connecting end facing to the first end.

11. The support apparatus of claim 10, wherein the first connecting arm further comprises a middle connecting section located between the first connecting end and the second connecting end; wherein in a second direction, the middle connecting section extends in a direction away from the first end, and wherein the second end is a direction that the base points to the first door plate.

12. The support apparatus of claim 11, wherein in the second direction, the middle connecting section extends along a curve in the direction away from the first end.

13. The support apparatus of claim 11, wherein in the second direction, the middle connecting section extends obliquely along a straight line in the direction away from the first end.

14. The support apparatus of claim 10, wherein a first side wall of the first connecting end is flush with a second side wall of the second connecting end, the first side wall is away from the first end and the second side wall is away from the first end, and a width of the first connecting end is less than a width of the second connecting end.

15. The support apparatus of claim 10, wherein the first housing and the first door plate are of an integrated structure.

16. An electronic device, comprising:
a support apparatus; and
a foldable screen, wherein the foldable screen is attached to one side surface of the support apparatus;
wherein the support apparatus comprises:

a rotating mechanism;
a first housing, wherein the first housing is disposed on one side of the rotating mechanism, and is connected to a first door plate of the rotation mechanism; and
a second housing, wherein the second housing is disposed on the other side of the rotating mechanism, and the second housing being rotatably connected to the rotating mechanism;
wherein the rotating mechanism, comprising:
  a base, wherein two axial ends of the base are a first end and a second end;
  the first door plate; and
  a first connecting arm, wherein two ends of an extension direction of the first connecting arm are a first connecting end and a second connecting end, the first connecting end is connected to the base, the second connecting end is connected to the first door plate, and the first connecting end and the base have a rotational degree of freedom therebetween;
  wherein in a first direction, a distance between a center of the second connecting end and the first end is greater than a distance between a center of the first connecting end and the first end, wherein the first direction is parallel to a rotating axis of the first door plate, wherein in the first direction, a first distance is greater than a second distance;
  wherein the first distance is a minimum distance between the first end and a side wall of the second connecting end and facing to the first end, and the second distance is a minimum distance between the first end and a side wall of the first connecting end facing to the first end.

* * * * *

UNITED STATES PATENT AND TRADEMARK OFFICE
CERTIFICATE OF CORRECTION

| | | |
|---|---|---|
| PATENT NO. | : 12,395,576 B2 | Page 1 of 1 |
| APPLICATION NO. | : 18/016740 | |
| DATED | : August 19, 2025 | |
| INVENTOR(S) | : Jiuliang Gao et al. | |

It is certified that error appears in the above-identified patent and that said Letters Patent is hereby corrected as shown below:

On the Title Page

Change "(71) Applicant: HONOR DEVICE CO., LTD., Guangdong (CN)" to --(71) Applicant: HONOR DEVICE CO., LTD., Shenzhen (CN)--.

In the Specification

Column 7, Line 25, change "display is" to --display 10 is--.

Signed and Sealed this
Sixteenth Day of September, 2025

Coke Morgan Stewart
*Acting Director of the United States Patent and Trademark Office*